(12) United States Patent (10) Patent No.: US 7,268,641 B2
Zucker et al. (45) Date of Patent: Sep. 11, 2007

(54) METHOD AND APPARATUS FOR DIGITAL SYNTHESIS OF MICROWAVES

(75) Inventors: Oved Zucker, Arlington, VA (US); Simon Y. London, Rockville, MD (US)

(73) Assignee: BAE Systems Information and Electronic Systems Integration, Inc., Nashua, NH (US)

( * ) Notice: Subject to any disclaimer, the term of this patent is extended or adjusted under 35 U.S.C. 154(b) by 95 days.

(21) Appl. No.: 11/147,453

(22) Filed: Jun. 8, 2005

(65) Prior Publication Data

US 2006/0279372 A1 Dec. 14, 2006

(51) Int. Cl.
*H03K 3/42* (2006.01)
(52) U.S. Cl. .......................... 333/20; 307/106; 331/96; 331/172
(58) Field of Classification Search ................ 307/106, 307/419, 421; 333/20; 331/96, 172, 173
See application file for complete search history.

(56) References Cited

U.S. PATENT DOCUMENTS

| 4,176,285 A | * | 11/1979 | Norris ......................... 307/106 |
| 4,176,295 A | | 11/1979 | Driver et al. |
| 4,329,686 A | | 5/1982 | Mourou |
| 4,536,723 A | | 8/1985 | Lang et al. ................. 331/127 |
| 5,109,203 A | | 4/1992 | Zucker et al. |
| 5,185,586 A | | 2/1993 | Zucker et al. |

FOREIGN PATENT DOCUMENTS

| GB | 589127 | 6/1947 |
| RU | 2128877 C1 | 2/1997 |
| RU | 2121216 | 10/1998 |
| RU | 2121217 | 10/1998 |
| RU | 2121218 | 10/1998 |
| RU | 2125340 | 1/1999 |
| RU | 2161858 | 8/1999 |
| RU | 2152126 | 6/2000 |
| RU | 2161859 | 1/2001 |
| RU | 2164054 | 3/2001 |

OTHER PUBLICATIONS

Ian Smith, Linear Induction Accelerators Made From Pulse-Line Cavities With External Pulse Injection, Rev. Sci. Instrum 50(6), Jun. 1979.

* cited by examiner

*Primary Examiner*—Stephen E. Jones
(74) *Attorney, Agent, or Firm*—Bingham McCutchen LLP

(57) ABSTRACT

Conductor segments are positioned within a two conductor transmission line in order to generate microwave pulses. The conductor segments are switchably coupled to one or the other of the transmission lines in parallel. Microwave pulses may be induced in the transmission line by closing the switches in a controlled manner to discharge successive segments into the transmission lines. The induced waves travel uninterrupted along the transmission lines in a desired direction.

10 Claims, 5 Drawing Sheets

METHOD AND APPARATUS FOR DIGITAL SYNTHESIS OF MICROWAVES

FIELD OF THE INVENTION

The present invention relates to a method and apparatus for generating microwaves and more particularly to a microwave source and a method for generating microwaves by digital synthesis.

BACKGROUND OF THE INVENTION

Digital synthesis of microwaves uses transmission lines and switches to generate a series of alternating polarity pulses. The coupling of the resulting pulse train to a load such as an antenna results in the radiation of a short microwave pulse. This approach has been investigated for over 30 years.

The general concept of producing microwaves by a sequential operation of switches is well known. High peak power microwave generation is addressed by Driver et al. in U.S. Pat. No. 4,176,295 in which the generation of microwaves by periodically discharging a plurality of identical, direct current energized, resonant transmission lines into a TE wave guide at half-multiple wavelength spacings is discussed. To periodically discharge the transmission lines, each line is provided with a switch, and all switches are simultaneously operated to cause the electromagnetic energy in the waveguide to propagate as a pulse train of microwave energy.

Mourou, in U.S. Pat. No. 4,329,686 discusses an arrangement, similar to that of Driver et al., which uses a TE waveguide and a light activated solid state (LASS) switch for generating microwave pulses of picosecond duration, synchronously and in response to laser light pulses.

Unfortunately, the arrangements described by Driver et al. and Mourou do not produce clean microwave pulses and are limited in power since TE waveguides have impedances close to that of free space, typically 50 ohms or more, and therefore cause the LASS switches to operate outside the electric field and current density limits consistent with good high power design principles, specifically, unidirectional power flow in a continuously matched system.

Zucker, in "Light Activated Semiconductor Switches," UCRL Preprint, October 1977 discusses the use of a light-activated semiconductor switch, the basic principle of which is to create carriers in situ, thus obviating the need for diffusing the carriers necessary to transition a transistor or thyristor switch from a reversed biased (OFF) condition to a forward biased (ON) condition. Zucker discusses the use of a laser beam whose frequency is matched to the switching device band gap (1.09 eV for silicon) to turn ON a LASS switch in less than 1 ps. As discussed in the article, a switch having sub nanosecond turn on time, and capable of being turned off after current ceases to flow, would be required for microwave generation in order to allow for quick recharge and refire and for the establishment of coherence among independent microwave sources.

Such a switch is addressed by Proud et al. in their article "High Frequency Waveform Generation Using Optoelectronic Switching in Silicon" IEEE Trans on Microwave Theory and Techniques, Vol. MTT-26, No. 3 (1978), in which the conversion of dc energy into RF pulses by using an array of silicon switches simultaneously activated by a laser pulse is discussed. Proud et al. describe a "frozen wave" generator comprising arrays of high-resistivity silicon switches fired by a gas laser designed to simultaneously fire all of the switches in synchronism. Both Zucker and Proud techniques are represented by FIG. 1, which discloses a group of transmission lines connected together by switches. In Zucker, the switches are activated sequentially, which gives flexibility in resulting wave shape, while in Proud the switches are activated simultaneously and produce frozen wave pulses. In both, the switches remain in the ON state during the transmission of the entire pulse train through the closed switches.

Mourou et al. in their article entitled "Picosecond Microwave Pulse Generation", Appl. Phys. Lett. 38(6) (1981) discuss the generation of a microwave burst in picosecond synchronization with an optical pulse using a LASS switch coupled to an x-band waveguide and describe the efforts of others to generate microwave pulses using electrically driven spark gaps and frozen wave pulses.

In U.S. Pat. Nos. 5,109,203 and 5,185,586, Zucker et al. teach:

(1) Sequential switching of two or more cascaded TEM transmission lines of arbitrary lengths, each transmission line being charged to an arbitrary voltage where the delay between any two switching events is equal or greater than the temporal length of the transmission line separating them with the first switch activated (closed) being the one closest to the load.

(2) The use of an optimized transmission line and switch geometry to yield the highest possible power flow.

(3) A "folded" microwave source configuration to provide added compactness and simplified energizing of the transmission lines.

(4) The use of reverse biased light activated solid state diodes as switches to provide for extremely rapid switch recovery upon recharging of the transmission lines after discharge, the recharging operating to forcefully reverse bias the diodes.

Despite the above advantages, the implementation of a transmission line as a series of segments coupled together by switches causes problems when trying to provide a number of pulses in series. This is because each pulse within sequential switching systems or frozen wave systems travels through several closed switches implemented in series. Therefore, the signal level attenuates as the signal propagates through each closed switch due to the residual resistance of each closed switch. Thus, sequential switching systems are not desirable for certain applications because of attenuation problems and are limited by a low number of pulses.

A circuit called a Blumeline generator (U.K. Patent N/589127, 1941), depicted in FIG. 1B, has been used and based on a voltage inversion principle to generate power. The Blumeline generator operates using two identical two conductor lines. They can be incorporated in a single or a three conductor transmission line. In the latest version, the central conductor is charged to a voltage (V) relative to each of the outer two conductors. A single switch connects the central conductor to one of the outer conductors. When the switch is closed, the voltage on the switched line is inverted and, after a time equal to the delay of this line, both lines start to discharge to a load, converting the full stored potential energy into power on the load during double transit time of the line.

The Blumeline generators may be implemented in a stacked configuration (for increasing power) to enable the conversion of power from more than two transmission line segments. This is shown in FIG. 1C as one of the options for two stacked Blumeline generators. The stacked Blumeline generators, like the conventional Blumeline generator, generate a single unipolar pulse when the switches are closed (at the same time) that drives the load after the equal time delay of each line. Neither the Blumeline generator nor the stacked one, however, has been used for digital synthesis or to generate microwave signals in a series of bipolar pulses on the common load.

There remains a need for a system that generates pulses with a high pulse rate. There remains a further need for a system that generates a longer series of pulses, that do not suffer significant attenuation with each successive pulse. There remains a further need for such a system to be implemented with switches that exhibit short rise time and jitter, and high switch power with or without low ON resistance.

SUMMARY OF THE INVENTION

According to the present invention to form a three conductor system, conductor segments are positioned within a two conductor transmission line in order to generate microwave pulses. This allows the conductor segments to be switchably coupled to one or the other of the transmission lines. Thus, unlike the prior art, microwave pulses are induced from a series of conductive segments into uninterrupted transmission lines which carry the signal in a desired direction. The signal does not have to propagate through more than one closed switch, and thus more pulses may be synthesized in a pulse train with higher efficiency. This arrangement is susceptible to multiple implementations.

For example, according to one embodiment of the invention, each conductor segment may be charged to a different polarity and/or voltage as compared to the conductor segment on either side of it. In this implementation, all of the conductive segments are coupled through switches to one of the transmission line conductors. In this arrangement, the switches may be closed by any stimulation technique to produce a pulse train. According to one embodiment, the apparatus functions by sequentially activating switches from back to front along the pair of transmission lines, thereby discharging the segments (each charged to a selected voltage) in series into the continuous transmission lines. Appropriate timing of the closing of the switches is used to create a microwave signal having desired properties, high power and high frequency. Because the switches are placed in parallel with the transmission line during wave propagation, lower quality switches may be used. Higher quality switches, such as LASS switches, may be used to give higher power and precise control of the signal and to allow coherence between multiple such sources to facilitate the creation of a phased array system. The power of the pulse generated by such a system may be high, for example a 100 kV 50 ohm system may produce a 50 MW pulse. A 10 kV, 0.1 ohm system may produce a 250 MW pulse. An adiabatic transformer may be used to provide coupling to an antenna. In principle, the system is simple and allows compact design.

According to another embodiment, the conductive segments may be charged to the same voltage potential and the switches associated with each conductive segment may be coupled to opposite ones of the transmission line conductors in an alternating fashion. In this arrangement, the switches may be closed by any stimulation technique to produce different pulse trains. According to one embodiment, the apparatus functions by sequentially activating switches from back to front along the pair of transmission lines, thereby discharging the segments (each charged to a selected voltage) in series into the continuous transmission lines. Appropriate timing of the closing of the switches is used to create a microwave signal, a pulse train, having high power and high frequency.

According to still another embodiment, a folded implementation may be used. Conductors with the same potentials sequentially may be coupled together to form a "meander type" wave propagating structure.

Still other embodiments include changing the polarity and amount of charge placed on each conductive segment, changing the dimensions of the conductive segments relative to one another, placing the conductive segments in the center between the two transmission lines or in an offset configuration, changing the delay between switching time and introducing a taper into the transmission lines.

BRIEF DESCRIPTION OF THE DRAWINGS

The above described features and advantages of the present invention will be more fully appreciated with reference to the detailed description and appended figures in which.

DETAILED DESCRIPTION OF THE INVENTION

According to the present invention, transmission line conductor segments are positioned within a three conductor transmission line in order to generate microwave pulses. This allows the conductor segments to be switchably coupled to one or the other. Thus, unlike the prior art, microwave pulses are induced from a series of conductive segments into uninterrupted transmission lines, which carry the signal in a desired direction. The signal does not have to propagate in the desired direction through more than one closed switch, and thus longer and more powerful pulse trains may be produced. This arrangement is susceptible to multiple implementations.

Figure 1A:
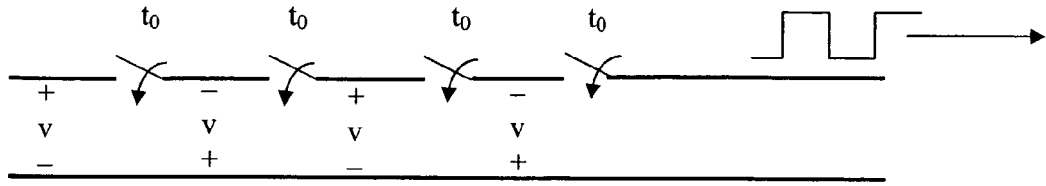
FIG. 1A depicts a method of generating microwave pulses according to the prior art.
Figure 1B:
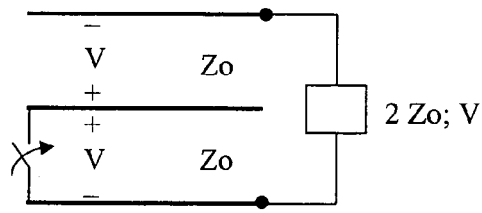
FIG. 1B depicts a Blumeline according to the prior art.
Figure 1C:
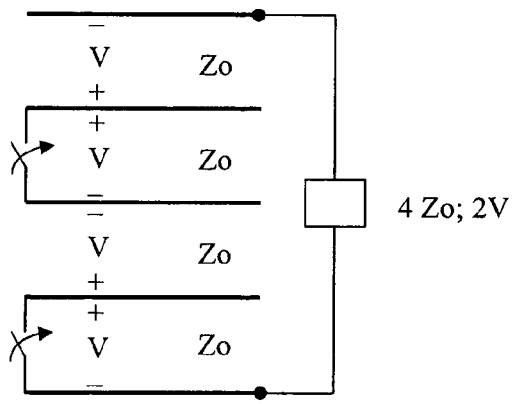
FIG. 1C depicts two stacked Blumelines according to the prior art.
Figure 2:
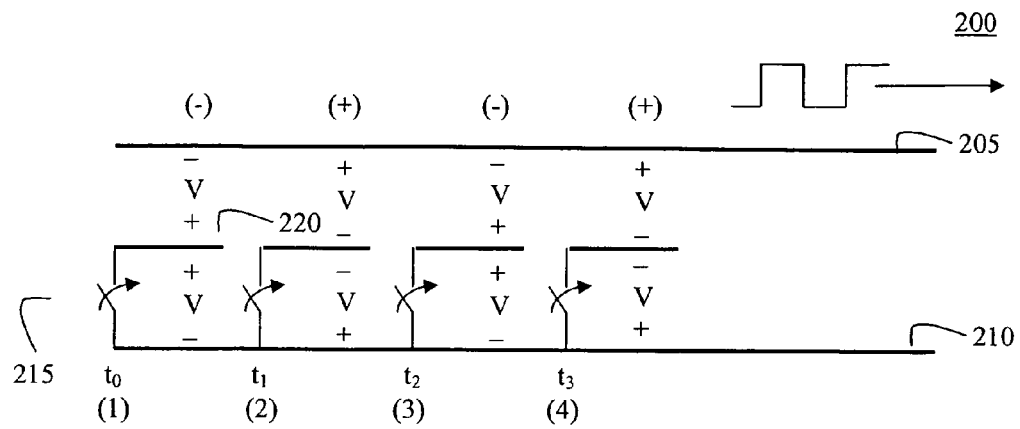
FIG. 2 depicts an embodiment of the present invention implementing transmission line segments having alternating polarity and equal time delay $\tau$.

FIG. 2 depicts a digital synthesis transmission line structure 200 that generates microwave pulses according to an embodiment of the present invention. Referring to FIG. 2, the digital synthesis transmission line 200 includes two conductors 205 and 210 on either side of a plurality of center transmission line segments 220. These segments form two conductor transmission line sections with conductors 205 and 210, respectively. The first conductive or central segment is charged to a different voltage than the adjacent central segments 220 and the surrounding conductors 205 and 210. The first segment 220 has a positive charge relative to the surrounding conductors 205 and 210. Adjacent central segments 220 have opposite polarity. Thus, for example, adjacent center segments may be charged as a series to +V, −V, +V, −V, as shown. The structure 200 further comprises switches 215 that couple each center segment 220 to the conductor 205.

During operation, each of the switches 215 is closed in a desired sequence. The discharge of each center segment 220 generates a wave in the transmission line with conductors 205 and 210, which predominantly travels to the right. (A fraction also travels to the left as discussed below). The voltage generated by discharging the first center segment 220, shown as (1), travels only to the right.

Referring to FIG. 2, as the pulse travels to the right in the transmission lines (205 and 210) from the closing of the first switch shown as (1), it passes the beginning of the second central segment, and the switch shown as (2) is closed, and the second center segment 220, which is charged negatively, is discharged through switch (2) into the transmission lines (205 and 210). This produces a similar pulse traveling to the right. However, the pulse has the opposite polarity when compared to the pulse induced by the first segment, and some energy travels backward along the transmission lines. The backward flow of energy in the transmission lines formed by conductors 205, 210 and the second segment of 220 is impeded by both impedance mismatch and the presence of the still closed first switch of the first segment 220, which results in small reduction in forward energy flow. Switches (3) and (4) are also closed one after the other when the pulse train passes each respective switch.

Using the structure of FIG. 2, a train of pulses having alternating polarities is produced. The number of pulses is determined by number of conductive segments and corresponding switches. The width and height of the pulses may be varied by varying the geometry of the center segment relative to the conductors 205 and 210, the dielectric constant of material within the transmission line structure, and the distance of the central conductor segment from the upper and lower surfaces 205 and 210, among other variations. As discussed further below, other factors affecting the waveform produced by the structure 200, which are controllable to produce a desired effect, include the amount of charge placed on each segment (center conductor 220) and the timing of turning on (closing) each of the switches 215.

Figure 3:
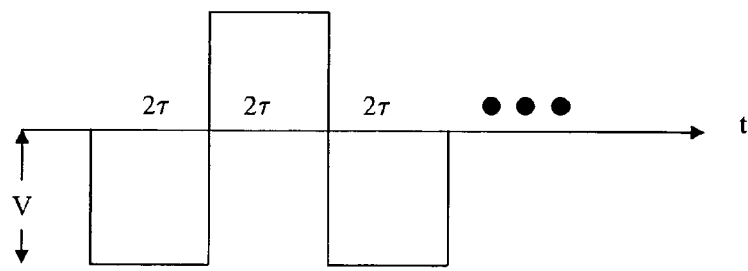
FIG. 3 depicts a pulse train produced by transmission line structures according to an embodiment of the present invention.

FIG. 3 depicts an example of bipolar pulses in a train waveform produced by a structure such as that shown in FIG. 2. Referring to FIG. 3, the amplitude of the bipolar pulse is +V and −V. The width of each polarity pulse is 2τ, where τ is the transit time along the length of the line formed by a conductive segment. When the conductive segments are spaced immediately next to each other, and there is no space in time between positive and negative pulses, it generally takes 3τ from the closing of a switch for the pulse to pass the beginning of the next conductive segment and closing the next switch. By closing the switches (1), (2), (3), (4) in approximately 3τ increments, the pulse train as shown in FIG. 3 is created.

Figure 4:
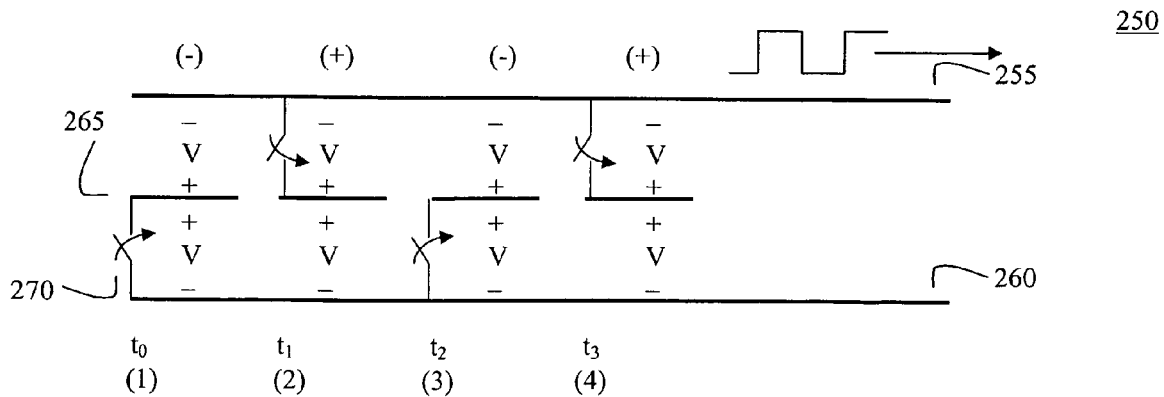
FIG. 4 depicts an embodiment of the present invention wherein the segments are charged to the same polarity and have equal time delay $\tau$.

FIG. 4 depicts a transmission line structure 250 according to an another embodiment of the present invention. Referring to FIG. 4, transmission line conductors (255 and 260) surround a plurality of center segments 265. However, unlike FIG. 2, all of the center segments 265 in FIG. 4 are charged to the same polarity and every other center segment 265 is coupled through a switch 270 to a respective one of the transmission line conductors 255 or 260 as shown.

In this arrangement, during operation, the switches 270 may be closed by any stimulation technique, generally as indicated by the sequence (1), (2), (3) and (4), as described above, to produce a desired pulse train having pulses that travel to the right, with some energy losses when traveling in the backward direction. Even though the center segments are all charged to the same voltage polarity, the effect of discharging alternately into the upper and lower transmission line conductors 255 and 260, respectively, creates a train of pulses having alternate polarities. According to one embodiment, the waveform produced is as illustratively shown in FIG. 3.

Figure 5:
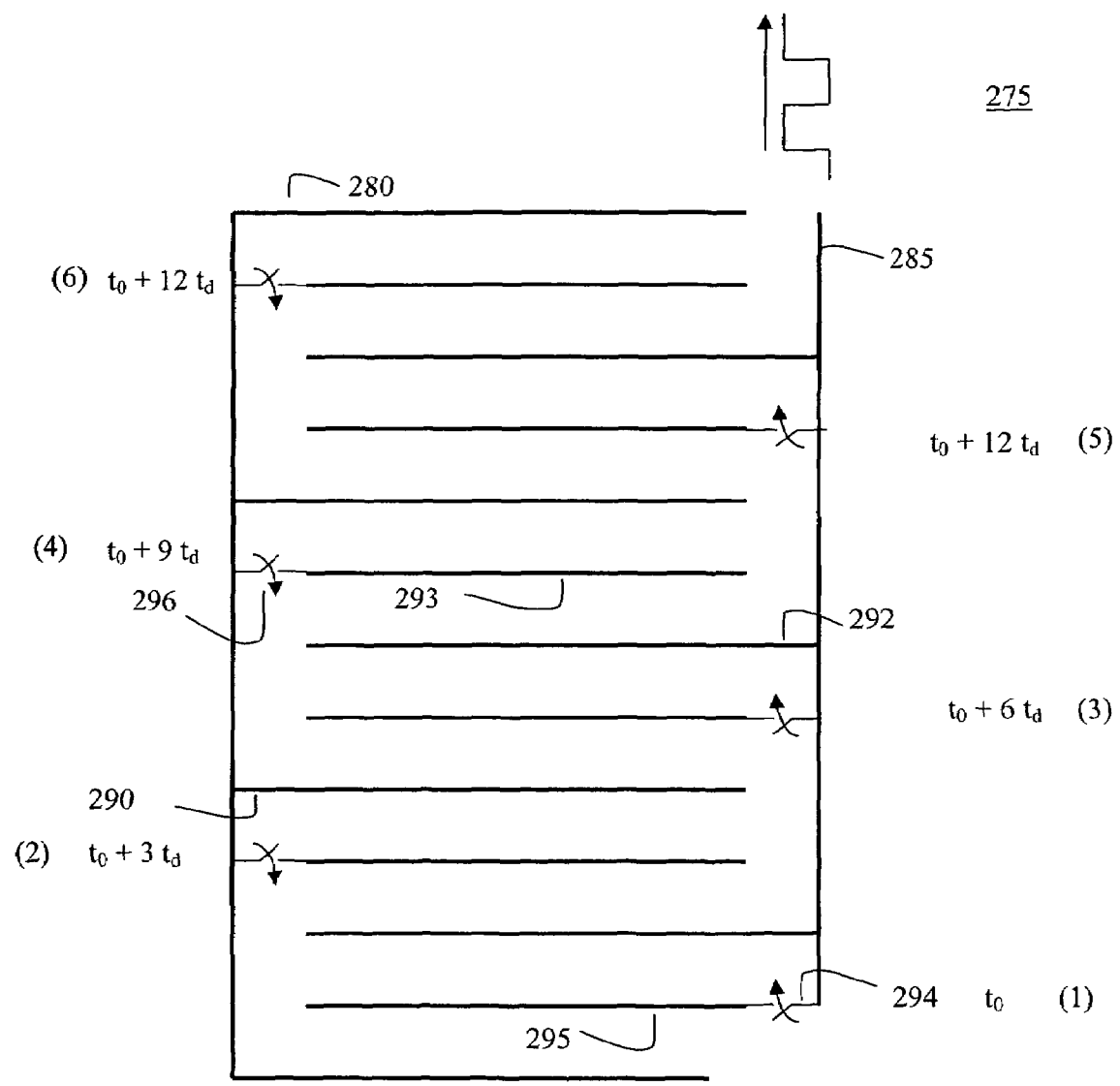
FIG. 5 depicts an embodiment of the present invention wherein the apparatus is folded into a compact arrangement.

FIG. 5 depicts a transmission line structure 275 having a folded arrangement. The folded geometry allows for increased compactness by permitting stacking of conductors. Referring to FIG. 5, the structure 275 incorporates two transmission lines 280 and 285 with respective interdigitated fingers 290 and 292 as shown. Central segments are placed between the transmission lines 280 and 285 in the recesses between the interdigitated fingers. In particular, a series of central conductors 293 are positioned at a desired distance from the transmission line 280. Each central conductor 293 is coupled to the transmission line 280 through a respective switch 296. Similarly, each central conductor 295 is coupled to the transmission line 285 through a respective switch 294. The central segments may be coupled together in series by another conductor 298 to allow a voltage potential to be deposited on the central segments from one side of the transmission line structure 275.

In order to simplify charging the somewhat hidden central conductors of the folded structure 275, it is convenient to charge the central conductors by applying a voltage to the central conductors from one end thus charging all of the center segments to the same polarity at the same time. In between each of the segments, a resistor 299 may be placed to insert a time constant to slow wave propagation between center segments, thus effectively electrically isolating each of the segments during pulse generation. The resistor 299, however, is selected so that it still allows charging of the central segments at an appropriate rate given the duty cycle of signals generated by the structure 275.

The central segments of the FIG. 5 scheme, being charged to the same potential and coupled to alternating transmission lines 280 and 285, through closing switches, thus resembles and operates the same as the structure of FIG. 3. Accordingly, during operation, the switches are closed in series (1), (2), (3), (4), (5) to produce a train of pulses in transmission lines 280 and 285.

The switches 293 and 295 may be implemented as any type of switch according to ordinary design considerations. Because the switches are not placed in series, however, the switches may have a lower on or closed resistance relative to those required by prior art techniques and thus they may be less expensive or fancy depending on the application. For high power or performance applications, high performance switches may be desired. When the switches 293 and 295 are implemented as photoconductive switches in the folded configuration, and the configurations shown in FIG. 2 and FIG. 3, the switches may be embedded within the structure.

According to one embodiment of the present invention, at least a portion of at least one of the transmission lines within the transmission line structures may be implemented as a mesh structure that has sufficient transparency to allow laser light to be applied from outside the structure to a photoconducting switch within the structure. When photoconducting switches are implemented, the switches may be stimulated by applied light to produce microwave pulse trains.

Figure 6:
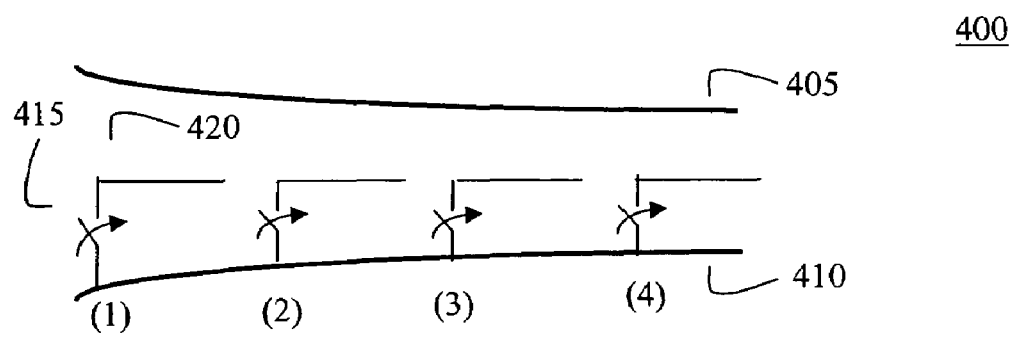
FIG. 6 depicts an embodiment of the present invention where the transmission line segments are tapered relative to one another.

FIG. 6 depicts a transmission line structure 400 according to still another embodiment of the present invention. Referring to FIG. 6, the structure 400 includes transmission line conductors 405 and 410 that are tapered. In particular, beginning on the left, the conductors are spaced relatively closely.

The structure 400 may be implemented using any of the techniques shown herein, including those shown in FIGS. 2-4. Referring to FIG. 6, the structure 400 includes central conductive segments that are positioned between the conductors 405 and 410. The central conductive segments are coupled, respectively, through switches 415 to the lower conductor 410. The switches may be switched in the sequence shown (1) (2) (3) (4) to create a pulse train that travel to the right along the transmission line structure 400.

The advantage of the taper is that at high frequencies and power levels, the conductors themselves become an impediment to efficient operation of the structure for generating signals. The taper tends to reduce the effect of conductor losses, particularly for the segments that are furthest away from the right end of the structure 400. The taper may be introduced in the section of the transmission line where the switches are implemented, or may be introduced on either end of the section with the switches.

Figure 7:
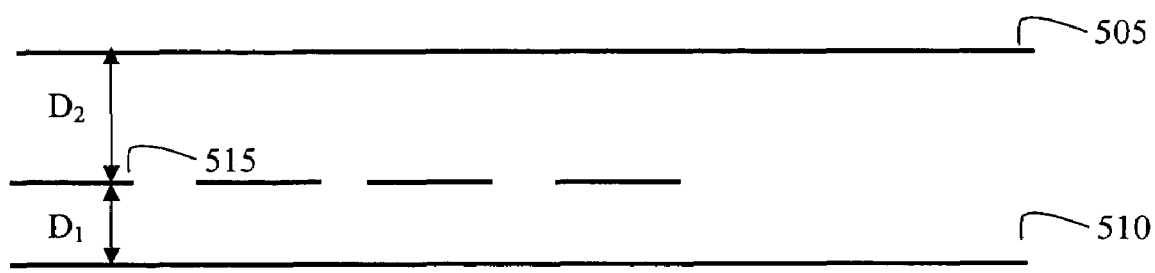
FIG. 7 depicts an embodiment of the present invention illustrating the placement of the central conductors relative to the transmission line conductors.

FIG. 7 depicts an illustration of the positioning of central conductor segments relative to outer transmission lines according to still another embodiment of the present invention. Referring to FIG. 7, a digital synthesis transmission line structure 500 is shown as having outer transmission line conductors 505 and 510, respectively, and central conductive segments 515. According to one embodiment of the invention, applicable to any of the transmission line structures shown herein, including those shown in FIGS. 2, 4-6, the distance at which the central conductive segment 515 is situated relative to the lower conductor 510 (D2) and the upper conductor 505 (D1) may be set at any convenient value. In some embodiments it may be desirable to have D1=D2. In other embodiments it may be desirable to have D1>2 D2 or vice versa. Any ratio of D1 to D2 is contemplated by the applicants and this ratio gives designers of digital synthesis transmission line structures an additional degree of freedom for design alternatives.

These techniques may be used to alter the amount of charge induced by each segment to configure the pulse amplitude and shape. Similarly, the spacing between conductors may be used to alter the pulse configuration.

Figure 8A:
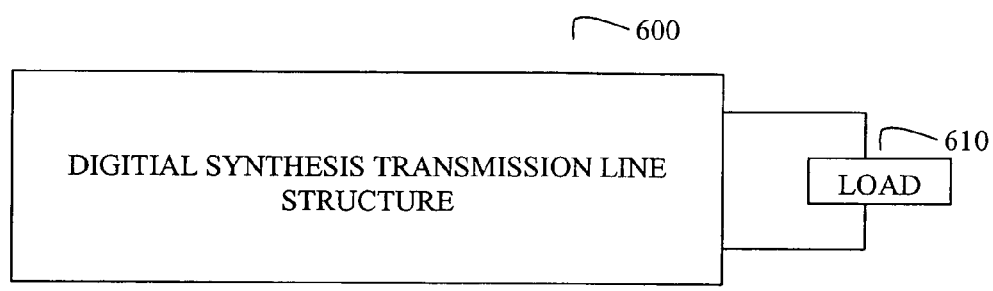
FIG. 8A depicts an embodiment of the present invention illustrating a block diagram of a digital synthesis transmission line structure with a load on the operative end.
Figure 8B:
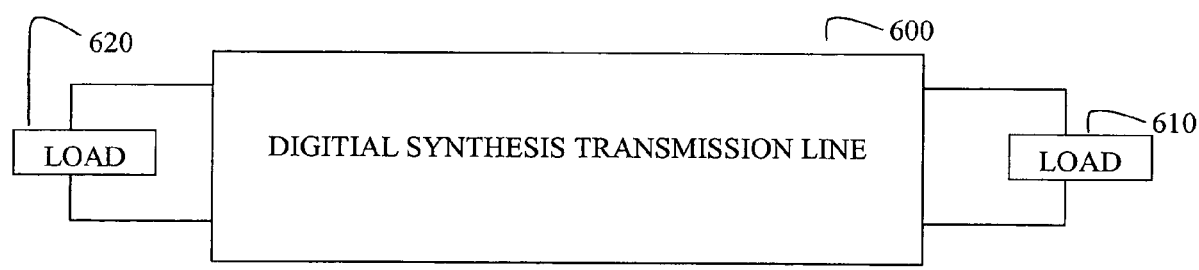
FIG. 8B depicts an embodiment of the present invention illustrating a block diagram of a digital synthesis transmission line structure with a load on the operative end and the near end.

FIGS. 8A and 8B depicts an illustrative digital synthesis transmission line structure 600 showing different load termination options. The structure 600 may be any of those depicted in FIGS. 2, 4-7. Referring to FIG. 8A, it is apparent that the structure 600 may be terminated with a load 610 only at the right end. This load may be, for example, a radiator or antenna that presents a matched impedance to the transmission line structure 600. In a matched impedance scenario, the radiator or antenna does not produce reflections back into the structure and may be used to transmit the pulse train produced by the digital synthesis transmission line structure with high efficiency.

FIG. 8B depicts an illustrative digital synthesis transmission line structure 600 with load terminations 610 and 620, respectively, at either end. The structure 600 may be any of those depicted in FIGS. 2, 4-7. Referring to FIG. 6B, it is apparent that the structure 600 may be terminated with a load at both ends. These loads may be, for example, radiators or antennas that present a matched impedance to the transmission line structure 600 that does not produce reflections back into the structure and that may be used to transmit the pulse trains produced by the digital synthesis transmission line structure with high efficiency.

The load 620 may be present a matched impedance to the transmission line and may be used to eliminate reflections from signals traveling from the right to the left in the digital synthesis transmission line structure, thus making the pulse train traveling from left to right more pure. In some embodiments, it may be desirable to omit load 620 to produce a more efficient (nearly total) output of energy from the structure. In other embodiments, the characteristics desired for the output signal may dictate using a matched load 620. In still other embodiments, the load 620 may be a radiator which provides the ability to generate and propagate signals out of both ends of the structure 600.

While particular embodiments of the present invention have been described, it will be understood by those having ordinary skill in the art that changes may be made to those embodiments without departing from the spirit and scope of the invention.

What is claimed is:

1. An apparatus for generating a plurality of electrical impulses, comprising:
    two transmission line conductors;
    a plurality of conductive segments interposed between and electrically isolated from the two transmission lines, the segments capable of being charged;
    wherein each segment is operatively connected through a switch to one of the two transmission lines to create a microwave signal on the transmission lines.

2. The apparatus according to claim 1, wherein the switch is optically activated.

3. The apparatus of claim 1, wherein the segments are operatively connected via the switches to alternating sides of the transmission lines.

4. The apparatus of claim 1, wherein the segments are operatively connected via the switches to the same one of the transmission lines.

5. The apparatus of claim 1, wherein the transmission line conductors are tapered relative to one another.

6. The apparatus of claim 1, wherein the segments are in the center between the transmission line conductors.

7. The apparatus of claim 1, wherein the segments are in between the transmission line conductors and offset from the center between the transmission line conductors.

8. The apparatus of claim 1, wherein the plurality of conductive segments are disposed in a single plane.

9. The apparatus according to claim 1, wherein the transmission lines are coupled to a load on an operative end.

10. The apparatus of claim 9, wherein the load is an adiabatic transformer.

* * * * *